United States Patent [19]
Mullen, III et al.

[11] Patent Number: 4,598,972
[45] Date of Patent: Jul. 8, 1986

[54] HIGH DENSITY ELECTRICAL LEAD

[75] Inventors: William B. Mullen, III, Boca Raton; Glenn F. Urbish, Coral Springs, both of Fla.

[73] Assignee: Motorola, Inc., Schaumburg, Ill.

[21] Appl. No.: 689,493

[22] Filed: Jan. 7, 1985

Related U.S. Application Data

[63] Continuation of Ser. No. 402,467, Jul. 28, 1982, abandoned.

[51] Int. Cl.$^4$ ............................................. H01R 11/22
[52] U.S. Cl. ............................. 339/258 R; 339/275 R
[58] Field of Search ............ 339/17 L, 258 R, 258 P, 339/276 T, 275 R

[56] References Cited

U.S. PATENT DOCUMENTS

| | | | |
|---|---|---|---|
| 1,251,856 | 1/1918 | Barr . | |
| 2,621,227 | 12/1952 | McMahon | 173/328 |
| 3,142,891 | 8/1964 | Travis | 339/258 R |
| 3,235,829 | 2/1966 | Haefele | 339/17 |
| 3,484,696 | 12/1969 | Taylor et al. | 325/354 |
| 3,528,050 | 9/1970 | Hindenburg | 339/95 R |
| 3,555,493 | 1/1971 | Baumanis | 339/176 |
| 3,673,551 | 6/1972 | McDonough | 339/258 R |
| 3,790,916 | 2/1974 | Keitel | 339/95 R |
| 3,808,589 | 4/1974 | Bonhomme | 339/17 L |
| 3,917,375 | 11/1975 | Johnson | 339/112 R |
| 3,993,383 | 11/1976 | Marino | 339/17 L |
| 4,037,915 | 7/1977 | Cabaud | 339/258 P |
| 4,226,496 | 10/1980 | Langham | 339/176 MP |
| 4,270,829 | 6/1981 | Wilson | 339/258 R |
| 4,302,067 | 11/1981 | Monson et al. | 339/275 R |
| 4,345,814 | 8/1982 | Gutbier et al. | 339/275 R |

OTHER PUBLICATIONS

NAS Electronics—Micro Circuit Edge Clip.
Comatel—Com-Clip Process—Edition 2, Jan. 1982.

*Primary Examiner*—Gil Weidenfeld
*Assistant Examiner*—Paula A. Austin
*Attorney, Agent, or Firm*—Martin J. McKinley; Joseph T. Downey; Edward M. Roney

[57] ABSTRACT

An improved electronic clip-on lead is disclosed. It is comprised of an elongated shaft suitable for electrical connection having a front spring finger extending from one end. A rear bracing member is positioned behind and parallel to the front spring finger by a support structure which fixes the displacement of the rear bracing member to the front spring finger.

2 Claims, 7 Drawing Figures

HIGH DENSITY ELECTRICAL LEAD

This is a continuation of application Ser. No. 402,467, filed July 28, 1982, now abandoned.

BACKGROUND OF THE INVENTION

1. Field of the Invention

This invention relates generally to the field of electrical leads and more particularly to the field of high density clip-on electrical leads suitable for use in either thick or thin film electronic microcircuits.

2. Description of the Prior Art

Microcircuit modules are frequently inserted into printed circuit boards edgewise to interconnect with other modules and circuits. This technique is typically used to produce high density electronic packages. The achievable degree of packaging density is a function of the module height and the real estate area projected onto the P.C. board. This projected area on the P.C. board is frequently referred to as the module's footprint.

A number of electrical leads suitable for use with thick and thin film or printed wire board (PWB) microcircuits are known and used in the art. A volumetrically efficient lead would have a low profile stand-off height and would not significantly increase the projected real estate over that occupied by the substrate, components, encapsulants, etc., alone. One of the first and volumetrically efficient of these leads is shown in FIG. 1 as lead 15. Volumetric efficiency allows for increased component density and is attained in the electrical lead art when the surplus real estate required by a particular lead is minimal. This surplus real estate is normally wasted since it utilizes volume which could otherwise be occupied by electronic components.

Lead 15 is perhaps the most widely utilized lead type and is commonly known as a paddle lead due to its paddle-like shape. This lead is comprised of an elongated shaft 20 which is suitable for electrical connection either by socket type connectors or soldering. At one end is located a substantially rectangular widened portion for use as a solder tab 25.

FIG. 2 illustrates the manner in which paddle lead 15 is affixed to a substrate 30 for example for use in a thick film microcircuit. The solder tab 25 of lead 15 is attached to a metallized zone on substrate 30 by solder or an equivalent. The substrate 30 is shown to have an electronic component 35 attached to its front (component side) surface. It is also shown inserted into a printed circuit (P.C.) board 37. Thus the component 35 attached to substrate 30 is connected to PC board 37 in an edgewise manner.

As FIG. 2 illustrates, the electronic components such as component 35 mounted to substrate 30 are normally much thicker than lead 15 (as shown in the horizontal direction). Therefore lead 15 overlies no more P.C. board area than that which would normally be required by the substrate and electronic components. Lead 15, therefore, exhibits high volumetric efficiency. Other microcircuits and components can be mounted on P.C. board 37 adjacent the thick film microcircuit since the paddle lead does not occupy any more space horizontally than do the substrate 30 and component 35.

Although this type of lead is very volumetrically efficient it has major drawbacks. Since solder is normally the only mechanism that affixes the lead to the substrate, the strength of the lead-to-substrate bond is very low. It is well known in the art that solder joints exhibit poor tensile strength. This may present a serious reliability problem when tensile stresses are applied to the joint. Such stresses occur for example, when the lead is peeled away from the substrate by a sudden mechanical shock. Often, a layer of protective epoxy is applied to the lead-to-substrate bond to reinforce the bond. This is a tedious and expensive operation, however, and epoxy can contaminate electrical components and inhibit soldering if slopily applied. Also there is nothing to hold the lead in place during the soldering operation resulting in the use of an external jig for positioning during assembly.

One technique which has been used with some degree of success to alliviate this reliability problem is the use of a shock pad 40, which is normally composed of a sponge rubber type material. Shock Pad 40 is placed between the substrate and the printed circuit board 37 prior to inserting a lead into the printed circuit board. This shock pad absorbs a portion of the stress associated with a sudden mechanical shock to the circuit thereby protecting the weak lead-to-substrate bond. It is by no means a complete solution to this problem however and installation of the shock pad is a tedious and expensive manual task.

The reliability of the lead-to-substrate bond is improved by using a lead of the type shown in FIG. 3. This type of lead is shown as 45 and commonly known in the art as a clip-on lead. Lead 45 also has an elongated shaft 20 suitable for electrical interconnection. The upper end of elongated shaft 20 widens into fork-like rear bracing members 50. A front spring finger 55 protrudes normal to the rear bracing members 50 and curves to an operative plane which is parallel to that of the rear bracing member but displaced in front of the rear bracing member 50.

Lead 45 is formed by a simple cutting and stamping process wherein spring finger 55 is cut from between rear bracing members 50. It is then bent forward to form the shape shown in FIG. 3. Since front spring finger 55 is comprised of metal taken from between rear bracing members 50 and bent, the upward length of front spring finger 55 is significantly shorter than that of rear bracing members 50.

FIG. 4 is a side view of clip-on lead 45 attached to substrate 30. Both the rear bracing member 50 and the front spring finger 55 are soldered to the substrate creating a secure bond which improves the reliability of the substrate to lead connection. Since both the rear bracing members 50 and the front spring fingers 55 are soldered in two different planes the lead is much harder to separate from the substrate 30. When this type of lead is bent away from the substrate tensile stress is minimized and the predominant stress mode on the solder joint is shear stress. Since solder has relatively high shear strength, in most all cases the use of a shock pad 40 (necessary for paddle lead 15) is no longer necessary when clip-on lead 45 is utilized.

This clip-on lead is not without disadvantages, however. Since the elongated portion 20 now protudes from the rear surface of substrate 30, the electrical length from the front surface of substrate 30 to the PC board is increased by approximately the substrate thickness. This additional electrical dimension can have significant circuit performance effects on high frequency RF circuits by changing the stray inductances and capacitances associated with the lead. These effects may necessitate a complete electrical redesign to account for such strays.

In addition, the protusion of the lead from the rear surface of substrate 30 makes retrofitting the clip-on lead to circuits (which presently use the paddle lead 15) impossible in many situations without substantial modifications to the printed circuit board in which the circuit will eventually be mounted. This adverse effect is due to the displacement of the lead location by a distance equal approximately to the thickness of substrate 30. This displacement not only occupies precious real estate on the PC board but often causes unacceptable mechanical interference with other electronic components. Both results are a great disadvantage in modern high density circuits.

It should also be noted that this prior art clip-on lead is almost as volumetrically efficient as the paddle lead shown in FIG. 1. Since there are typically no electronic components mounted on the rear surface of substrate 30, the addition of rear bracing member 50 and elongated shaft 20 to that rear surface actually increases the thickness of the entire microcircuit by an amount equal to $D_1$ which is the thickness of the elongated shaft of lead 45 and is typically on the order of 0.01 inch. This, however, is a minimal waste and normally judged to be an acceptable tradeoff owing to the increased reliability obtained by the clip-on lead.

In some instances lead 45 may be retrofitted to modules designed to use the paddle lead 15 by simply inverting the clip-on lead 45 as shown in FIG. 5. As long as a high density of components is not required for the P.C. board this can be an acceptable solution to the problem. However, this solution significantly increases the wasted real estate area to the rear of the substrate to $D_2$ as shown in FIG. 5 and typically increases the effective thickness of the microcircuits by about 0.017 inch over that of the original paddle lead version. In a typical application this increase results in a waste of at least 70% more volume than that of FIG. 4 and the circuit may mechanically interfere with or electrically short to other components.

If this modification is done for a number of multi-lead microcircuits for use on the same P.C. Board, the amount of wasted area can accumulate to an appreciable level thereby inefficiently utilizing the available volume. Thick film, thin film, and PWB microcircuits are typically expensive to manufacture and used primarily to increase circuit density. It is therefore highly undesirable to deliberately increase the amount of wasted space on such circuits by such large amounts. Due to the shape of lead 45, it is evident that the substrate surface area occupied by the front spring finger 55 is much less than that occupied by the rear bracing members 50. It is, therefore, not only an inefficient use of volume to invert lead 45, as shown in FIG. 5, but it also may result in a severe waste of the vital front surface area of substrate 30.

Thus, it can be seen that although substantial improvements in the reliability of the prior art paddle lead have been attained by the prior art clip-on lead there is still a substantial void to be filled in the electronic lead technology to optimize reliability, volumetric efficiency substrate front surface area and retrofit capability.

SUMMARY OF THE INVENTION

It is an object of the present invention to provide an improved clip-on electrical lead.

It is a further object of the present invention to provide an improved electrical lead which is retrofittable to electronic microcircuit substratres which formerly used the paddle lead.

It is another object of the present invention to provide a high reliability electronic lead which exhibits approximately the same electrical length from the front of the substrate to the PC board as the prior art paddle lead.

Another object of the present invention is to provide an electronic lead capable of greater substrate adhesion strength.

These and other objects of the invention will become apparent to those skilled in the art upon consideration of the following description of the invention.

The present invention is directed to providing a clip-on type electrical lead comprised of an elongated portion suitable for electrical connection. A front spring finger extends from the top end of the elongated portion and operates substantially in the same plane in the elongated portion. A rear bracing member is positioned parallel to but displaced behind the operative plane of the front spring finger. A support structure supports the rear bracing member to the elongated shaft. The support structure is appropriately dimensioned to fix the displacement of the rear bracing member from the operative plane of the front spring finger.

The features of the invention believed to be novel are set forth with particularity in the appended claims. The invention itself, however, both as to organization and method of operation, together with further objects and advantages thereof may be best understood by references to the following description taken in conjunction with the accompanying drawings.

DESCRIPTION OF THE PREFERRED EMBODIMENT

Figure 6:
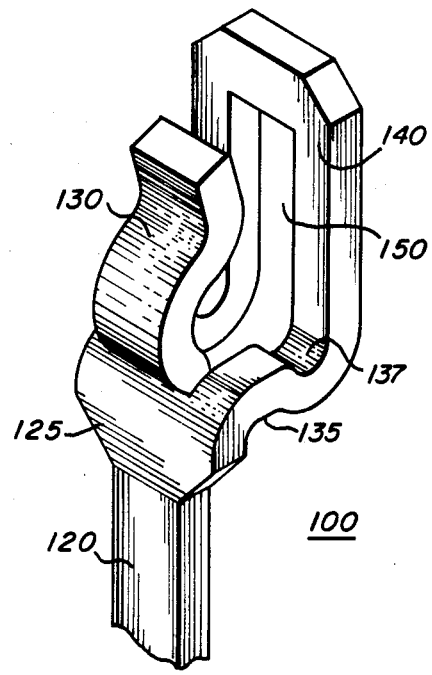
FIG. 6 shows an isometric view of the clip-on lead of the present invention.

The exemplary embodiment of the clip-on lead of the present invention is shown in FIG. 6 as lead 100. It is comprised of an elongated shaft 120 which is normally a plated metal suitable for electrical interconnection either by soldering or by entrapment in a socket. A widened area 125 of elongated shaft 120 is located on the upper end of the elongated shaft 120. A front spring-finger 130 protudes from the elongated shaft 120 though the widened area 125. In the preferred embodiment, the front spring finger curves in a generally S shape with the top of the spring finger 130 pointing outward from the front of the lead. This generally S shaped spring finger is curved to readily accommodate insertion of a substrate as will be seen in later figures.

The front spring finger 130 is generally operative in the same plane as the elongated shaft 120. Support structure 135 extends normal to the plane of the elongated shaft 120 from either side of spring finger 130. These support structures are actually extensions of the widened areas 125 which have been bent 90 degrees toward the rear of the lead in the preferred embodiment. Also in the preferred embodiment, a semicircular shaped downward dentent 137 is placed in the rearmost portion of each of the support structures 135 but these are not intended to be limiting.

The support structures 135 then extend upward to join at the upper-most point in a generally inverted U shape thereby forming a rear bracing member 140. An aperture 150 in the generally inverted U shaped rear bracing member 140 serves to improve solderability and increase solder joint strength to prevent the lead from pulling away from the substrate. This aperture 150 also allows gasses to escape or vent during the soldering process while improving the capillary action of the solder. The shape of rear bracing member 140 is such that a large surface area will contact the substrate metallizaton. These factors are all combined to greatly enhance the strength of the lead-to-substrate bond. In addition, the top connection of the inverted U shaped rear bracing member 140 allows the legs of the rear bracing member to be narrower than the fork-like rear bracing members 50 of the prior art if desired conserving substrate real estate without sacrifice of strength.

The stamping operation used to produce lead 100 is much more complex than the simple stamping operations of the prior art lead as one skilled in the art will readily appreciate. Forming operations must take place on support structures 135, rear bracing member 140 and front spring finger 130. It should be noted, however, that the front spring finger 130 is stamped from the metal that formerly filled aperture 150. In the preferred embodiment this allows the vertical height of rear bracing member 140 to be approximately the same height as front spring finger 130. In the preferred embodiment this results in a substantial rear substrate surface area savings over that of the typical prior art clipon lead. This will become increasingly important as more circuitry is placed on the rear of the substrate.

Figure 7:
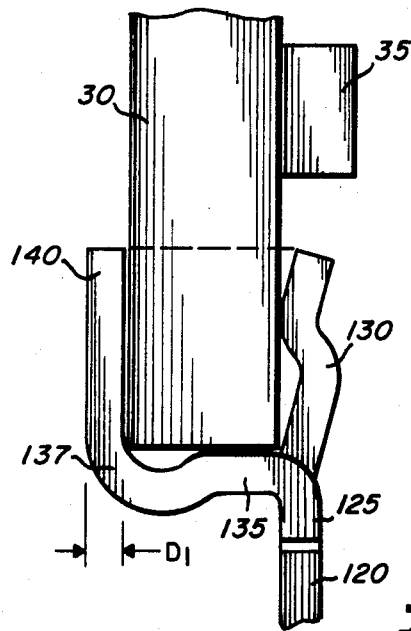
FIG. 7 illustrates the clip-on lead of the present invention attached to an electronic microcircuit substrate.

FIG. 7 shows the improved lead 100 attached to substrate 30. It is evident from this illustration that elongated shaft 120 indeed extends from the front of substrate 30 as did the most frequently used prior art paddle lead. Due to the mechanical attachment followed by soldering on both front and back the strength of the bond is greatly enhanced. During the soldering operation aperture 150 will fill with solder and the top of the rear bracing member 140 must cut through the solder in order for the lead to be pulled from the substrate. This greatly enhances the pull strength of lead of the present invention. Preliminary pull tests indicate the shaft often breaks before the solder joint fails.

Figure 1:
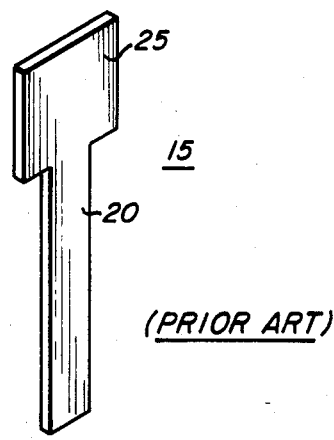
FIG. 1 shows a prior art paddle lead.
Figure 2:
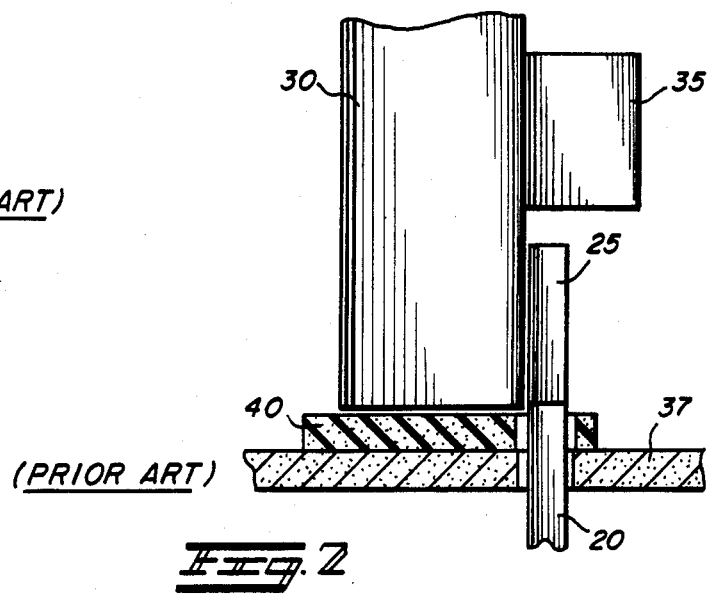
FIG. 2 shows a prior art paddle lead connected to an electronic microcircuit substrate.
Figure 3:
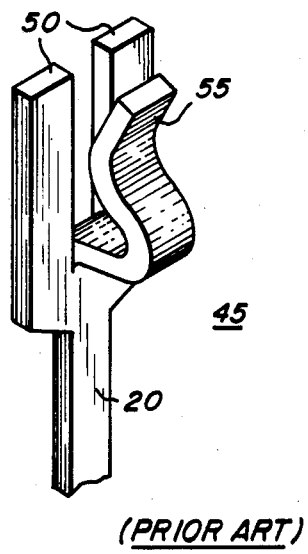
FIG. 3 shows an isometric view of a prior art clip-on lead.
Figure 4:
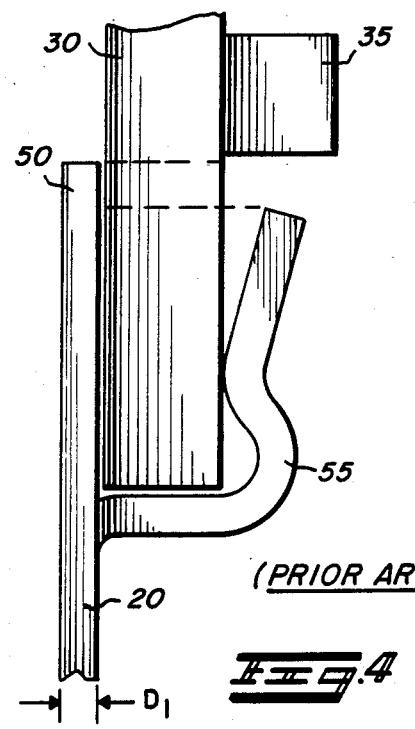
FIG. 4 shows a prior art clip-on lead attached to an electronic microcircuit substrate.
Figure 5:
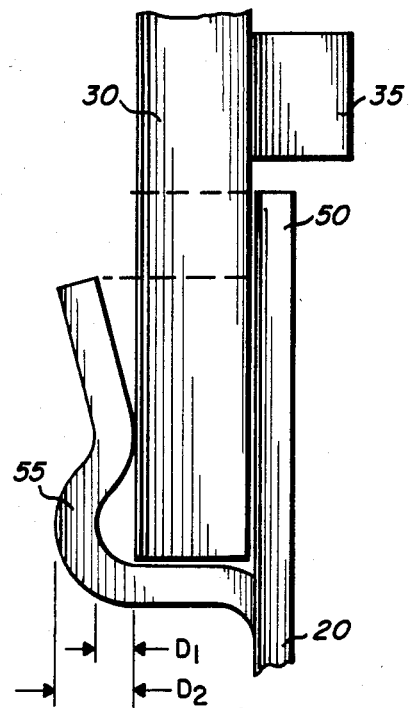
FIG. 5 shows a prior art clip-on lead attached to an electronic microcircuit substrate and mounted in the reverse of the manner in which it would normally be mounted.

It is also evident from FIG. 7 that the distance $D_1$ occupied by lead 100 at the rear surface of substrate 30 is no more than that of the prior art clip-on lead 45 attached as shown in FIG. 4 and much less than the distance $D_2$ shown in FIG. 5. Further, this is accomplished without the severe limitation of the lead's shaft extending from the rear of substrate 30.

In this configuration the widened portion 125 serves as a standoff to space the substrate 30 from the PC board by controlling the extent to which the elongated shaft may be inserted into a P.C. board hole of predetermined size. This to prevents electrical short circuits from the bottom of lead 100 to the PC board. This spacing may be adjusted to occupy no more height than that of the prior art shock pad 40 if desired. Alternatively, this spacing may be adjusted to any desired height. The added strength of the configuration of the present invention, however, allows circuits adapted to use this lead to be inserted into a PC board without necessity of shock pad 40.

It should also be noted that the electrical length from the substrate 30 through spring finger 130 to elongated shaft 120 is approximately the same length as that of the prior art paddle lead. The lead of the present invention may therefore be retrofitted even to high frequency RF circuits, which are highly sensitive to changes in lead lengths, without circuit redesign in most cases. Since even changes which seem relatively minor can have serious effects on the performance of such circuits.

The generally semicircular dentent 137 of support structure 135 allows substrate 30 to fully seat in the space between rear bracing member 140 and front spring finger 130 as shown in FIG. 7 without wasting area to the rear of substrate 30 or resorting to sharp bends which mechanically stress the metal. Support structure 135 fixes the displacement between rear bracing member 140 and front spring finger 130 such that spring finger 130 is flexed during the insertion of substrate 30. This slight flexure simplifies insertion and creates an interference fit between the lead 100 and substrate 30 which holds the lead in place for soldering eliminating the need for a jig and creates a very tight mechanical bond after soldering. The bond for the lead of the present invention is enhanced by solder joints in two planes and a mechanical interference fit.

In the preferred embodiment, lead 100 would be supplied in long reels. The leads would be connected together on the top and/or bottom by either breakaway or cutaway tie bars as is well known in the art. These double tie bars produce very accurate lead-to-lead spacing and facilitate installation, automation and handling.

Thus, it can be seen that the lead of the present invention is a clip-on type which can be easily retrofitted to microcircuits which have previously been designed to be used in conjunction with paddle type leads. This lead exhibits enhanced mechanical and electrical properties over either the paddle lead or the prior art clip-on lead and requires no shock pad.

Thus it is apparent that there has been provided in accordance with the invention a method that fully satisfies the objects aims and advantages set forth above. While the invention has been described in conjunction with specific embodiments thereof, it is evident that many alternatives, modifications and variations will be apparent to those skilled in the art in light of the foregoing description. Accordingly, it is intended that the present invention embrace all such alternatives, modifications and variations as fall within the spirit and broad scope of the appended claims.

What is claimed is:

1. A clip-on type electrical lead for use in conjunction with a planar substrate of predetermined thickness, said electrical lead comprising:
   an elongated shaft suitable for electrical connection;
   a front spring finger extending from one end of said elongated shaft, operative in substantially the same plane as said elongated shaft;
   a substantially flat rear bracing member, positioned parallel to but displaced behind the operative plane of said front spring finger, said rear bracing member having two legs joined by a top connection and having an aperture interior to said legs and said top connection, whereby the top connection increases the structural strength of the legs permitting the legs to be narrower than they would be without the top connection, thereby conserving substrate real estate when the lead is attached to the substrate, whereby the top connection increases the pull strength of the lead when the lead is soldered to the substrate, and whereby the substantially flat rear bracing member minimizes the protrusion of the lead from the rear surface of the substrate when the lead is attached to the substrate; and support means for supporting said rear bracing member to said elongated shaft, said support means being appropriately dimensioned to fix the displacement of said rear bracing member from the operative plane of said front spring finger to permit insertion of said substrate between said front spring finger and said rear bracing member so that said electrical lead and said substrate are held in engagement by spring force from said front spring finger, and said support means has a downward detent at its junction with said rear bracing member, thereby permitting the substrate to seat against the support means when the lead is attached to the substrate.

2. A clip-on type electrical lead for use in conjunction with a planar substrate of predetermined thickness, said electrical lead comprising:

an elongated shaft suitable for electrical connection;

a substantially S shaped front spring finger extending from the top end of said elongated shaft and operative in substantially the same plane as said elongated shaft;

a substantially inverted U shaped rear bracing member, positioned parallel to but displaced behind the operative plane of said front spring finger, said rear bracing member having two legs joined by a top connection and having an aperture interior to said legs and said top connection, whereby the top connection increases the structural strength of the legs permitting the legs to be narrower than they would be without the top connection, thereby conserving substrate real estate when the lead is attached to the substrate, and the top connection increases the pull strength of the lead when the lead is soldered to the substrate; and a support structure for supporting said rear bracing member to said elongated shaft, said support structure being appropriately dimensioned to fix the displacement of said rear bracing member to permit insertion of said substrate between said front spring finger and said rear bracing member so that engagement of said lead and said substrate is maintained by spring force from said spring finger, said support structure having a downward detent as its junction with said rear bracing member to permit the substrate to seat against the support means when the lead is attached to the substrate; and standoff means for controlling the extent to which said elongated shaft may be inserted into a PC board hole of predetermined size.

* * * * *